United States Patent [19]

Barbu

[11] Patent Number: 5,185,582
[45] Date of Patent: Feb. 9, 1993

[54] DIFFERENTIAL AMPLIFIER, PARTICULARLY OF THE CASCODE TYPE

[75] Inventor: Stéphane Barbu, Caen, France

[73] Assignee: U.S. Philips Corporation, New York, N.Y.

[21] Appl. No.: 874,256

[22] Filed: Apr. 24, 1992

[30] Foreign Application Priority Data

Apr. 30, 1991 [FR] France ................. 91 05291

[51] Int. Cl.⁵ ............................... H03F 3/45
[52] U.S. Cl. ........................ 330/261; 330/311
[58] Field of Search .............. 330/252, 261, 311

[56] References Cited

U.S. PATENT DOCUMENTS 4,881,044 11/1989 Kinoshita et al. ............. 330/26 X

Primary Examiner—James B. Mullins
Attorney, Agent, or Firm—Bernard Franzblau

[57] ABSTRACT

A differential amplifier stage including a main pair of transistors (T1, T2) having their bases connected to a pair of input terminals (V1, V2) and their collectors coupled to a supply terminal (Vcc) via respective cascode connected transistors (T5, T6). The emitters are interconnected to a current source. An auxiliary pair of transistors (T3, T4), have their bases connected to the pair of input terminals, their collectors coupled to a supply voltage (VCC'), and their emitters interconnected to a current source. A summation device supplies a part of the collector current from the auxiliary pair of transistors to the main pair of transistors. The summation device includes a first (R3, R5) and a second (R4, R6) resistor bridge coupled between the collectors of the main pair of transistors and the supply voltage (Vcc') with respective taps on the first and the second resistor bridge coupled to respective collectors for the auxiliary pair of transistors.

6 Claims, 2 Drawing Sheets

DIFFERENTIAL AMPLIFIER, PARTICULARLY OF THE CASCODE TYPE

BACKGROUND OF THE INVENTION

The present invention relates to an amplifier having a differential stage comprising two input transistor pairs arranged between a supply terminal and a reference terminal, the interconnected emitters of one pair called the main pair of input transistors being driven by an emitter current source, which is also connected to the reference terminal, and the interconnected emitters of another pair called the auxiliary pair of input transistors being driven in a similar way, the bases of the transistors of the main pair being connected to the corresponding bases of the transistors of the auxiliary pair and forming the input terminals for the input voltages whose difference defines a differential input voltage, a part of the collector currents of the transistors of the auxiliary pair being used for a suitable summation with the collectors of the transistors of the main pair, which summation yields output currents of the differential stage, in order to increase the linearity of said output currents in comparison with the differential input voltage.

Such a differential stage intended for use in an amplifier is known from the document JP-A-57 53114. In accordance with said document the current supplied by the collectors of the transistors of an auxiliary input pair is returned to the collectors of the opposed transistors of the main pair of input transistors by means of current mirrors. In this way a subtraction of the collector currents from the transistors of the auxiliary input pair from the collector current of the opposed transistors of the main pair of input transistors is effected at the output. In comparison with a differential stage comprising only two transistors, said arrangement results in currents at the collectors of the input pair being subtracted from other currents which vary in an opposite sense as a function of the variation of the differential input voltage.

This arrangement has a number of special characteristics: in particular it increases the transconductance of the differential stage and it also increases the linear range of the output current as a function of the differential input voltage.

Recent developments of circuits, particularly in the field of analog-to-digital converters, require that the linear range of the circuits should be extended as far as possible. The characteristics of the known differential stage meet this requirement to some extent.

However, for the above-mentioned use it is necessary that the differential output signal of the amplifier exhibits a strictly defined maximum (current or voltage) value and also that the transistors of the differential stage cannot be operated in the saturated mode if the differential input voltage extends beyond the linear range of the output signal. As a matter of fact, the differential amplifier would lose its band-pass characteristics if at least one transistor should become saturated at a given instant. The known differential stage does not have these properties.

Another drawback of this circuit results from the fact that it uses current mirrors with PNP transistors. It is well known that if a simple and therefore cheap technology is used the PNP-type transistors are slow in comparison with NPN-type transistors. Therefore, the known circuit will have a very limited pass band if it is to be used in consumer products for which an advanced technology allowing the use of fast PNP transistors cannot be considered since it is too expensive.

SUMMARY OF THE INVENTION

Therefore, it is an object of the invention to improve the linearity and preferably also the transconductance of a differential amplifier of the type defined in the opening paragraph, which amplifier does not have said drawbacks and can be implemented by means of NPN-type transistors only. Such an amplifier can then be realised with a cheap technology and can still have an excellent pass band extending up to high frequencies.

To this end an amplifier in accordance with the invention is characterised in that the differential stage comprises a pair of cascode transistors whose collector-emitter paths are arranged as loads in the collectors of the transistors of the main pair, and whose bases are interconnected and connected to a fixed intermediate reference voltage, and said summation is effected by means of two resistive bridges connected between a supply voltage and each of the respective collectors of the transistors of the main pair of input transistors, the collectors of the transistors of the auxiliary pair being connected to respective nodes of the respective resistive bridges.

In the amplifier in accordance with the invention the cascode transistor stage maintains the collector voltage of the transistors of the main input pair substantially at a fixed value, variations of the emitter-base voltage of the cascode transistors being ignored. Conversely, the collectors of the transistors of the auxiliary pair of input transistors are at a voltage which varies with the differential input voltage signal in such a way that a current which varies as a function of the differential input voltage is added to or withdrawn from the collector of the transistors of the main input pair. The afore-mentioned algebraic sum function is thus performed by the combination of resistor bridges and the presence of the cascode transistor pair without resort to PNP transistors. Thus, the amplifier in accordance with the invention can be realised in a simple and cheap technology while benefiting from an extended pass band.

As will be set forth in detail hereinafter, the amplifier in accordance with the invention has the property that it dictates a maximum excursion of the output current, or of the output voltage if resistive loads are arranged in the collectors of the cascode transistors, without any of the transistors of the amplifier being driven into saturation.

In an embodiment which is advantageous because of its simplicity, said supply voltage is the same voltage as that on the supply terminal. However, this arrangement is not essential and another supply voltage may be chosen, for example, for precisely defining the excursion at the output of the differential stage.

In a preferred embodiment the emitters of the transistors of the auxiliary input pair are driven by an emitter current source distinct from that driving the emitters of the main pair of input transistors. In this embodiment it is easier to determine the operation and, in particular, the quiescent point of the amplifier by an appropriate choice of the respective values of currents of the two emitter current sources.

BRIEF DESCRIPTION OF THE DRAWING

The invention will be more fully understood upon reading the following description, given by way of non-limitative example, with reference to the accompanying drawings, in which.

DESCRIPTION OF THE PREFERRED EMBODIMENTS

Figure 1:
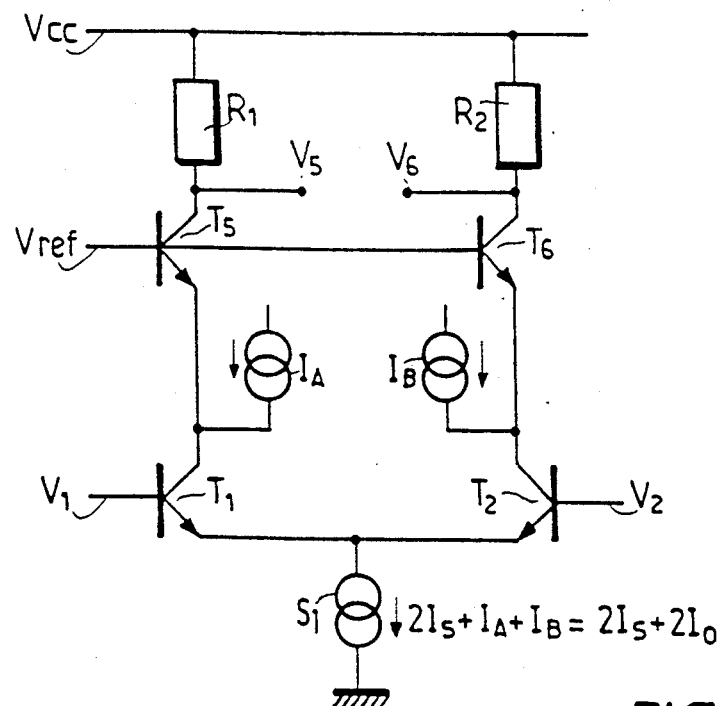
FIG. 1 shows the diagram of a differential amplifier to illustrate the comparison between the amplifier in accordance with the invention and prior-art amplifiers.

FIG. 1 shows an amplifier having a differential stage comprising a single pair of input transistors $T_1$, $T_2$, arranged between a supply terminal $V_{cc}$ and a reference terminal, in the present case earth ground. The emitters of the input transistors $T_1$ and $T_2$ are interconnected and are driven by an emitter-current source $S_1$ arranged between these emitters and ground. The base of the transistor $T_1$ receives a voltage $V_1$ and the base of the transistor $T_2$ receives a voltage $V_2$. The voltage $(V_1-V_2)=V_{in}$ is called the differential input voltage. A load is arranged in the collector of each of the transistors $T_1$ and $T_2$. As is shown, it is constituted by a cascode stage comprising two transistors $T_5$ and $T_6$ whose collector-emitter paths are arranged as the collector loads of the transistors of the pair of input transistors $T_1$ and $T_2$ and whose bases are interconnected and connected to a fixed intermediate reference voltage $V_{REF}$. The collectors of the transistors of the cascode pair $T_5$, $T_6$ are connected to the supply terminal $V_{cc}$ via equal load resistors $R_1$ and $R_2$ respectively. FIG. 1 also shows two auxiliary current sources $I_A$ and $I_B$, whose outputs respectively feed the nodes between the emitters of the transistors of the cascode pair $T_5$, $T_6$ and the collectors of the transistors $T_1$, $T_2$ of the differential input pair. In a prior-art device known from the document EP-A-0,275,079, in which the transistors are of the MESFET type, the auxiliary current sources $I_A$ and $I_B$ supply fixed currents $I_O$ such that:

$$I_A + I_B = 2I_O.$$

The current supplied by the emitter-current source $S_1$ is defined as equal to $2I_S + 2I_O$. The value of the current $I_S$ is such that an excursion of the output voltages $V_5$ and $V_6$ across the load resistors $R_1$ and $R_2$ remains within a specific range of values upon a variation of the differential input voltage $V_{in}$.

In the case of a conventional differential amplifier (without auxiliary current sources, $I_A$ and $I_B=0$) whose emitter current source has a value $2I_S$, the effective transconductance $g_{m1}$ has a value:

$$g_{m1} = I_S/V_T,$$

in which $V_T$ corresponds to kT/q, which is substantially equal to 26 mV.

If the auxiliary current sources $I_A$ and $I_B$ each supply a current $I_O$ a simple calculation will show that the transconductance $g_{m2}$ now becomes:

$$g_{m2} = (I_S + I_O)/V_T > g_{m1}.$$

It is evident that in this case an increase of the current from the emitter current source $S_1$ leads to an increase in transconductance of the differential amplifier and a correlated increase of the voltage gain at the output $(V_5-V_6)$ relative to the differential input voltage $V_{in}$.

An additional increase in transconductance can be obtained when the currents supplied by the auxiliary current sources $I_A$ and $I_B$ are not fixed but vary in a mutually opposite sense as a function of the differential input voltage $V_{in}$. It is assumed that:

$$I_A = I_O(1 - f(V_{in}))$$

$$I_B = I_O(1 + f(V_{in}))$$

$f(V_{in})$ being an increasing monotonic function of the differential input voltage $V_{in}$. The effective transconductance $g_{m3}$ then becomes:

$$g_{m3} = ((I_S + I_O)/V_T) + I_O f'(o).$$

in which f'(o) is the derivative in the origin of the curve $f(V_{in})$. To increase the transconductance $g_{m3}$ it is merely necessary that the function f'(o) be positive and in the amplifier known from the document JP-A-57 53114 this is achieved in that the auxiliary current sources $I_A$ and $I_B$ shown in FIG. 1 are the collector currents of an additional pair of input transistors coupled to the main pair of input transistors $T_1$ and $T_2$. The collectors of the transistors of the additional pair of input transistors are cross-coupled to the collectors of the main pair of input transistors so as to realise a suitable current summation, yielding the increasing monotonic funtion f whose derivative has the appropriate sign.

As already stated hereinbefore, the known amplifier, which is not of the cascode type, utilises current mirrors with PNP transistors. When a conventional integrated circuit technology is to be used such PNP transistors will be slow and such an amplifier will have a very limited pass band.

The invention proposes to realise the same function by varying the currents of the auxiliary current sources $I_A$ and $I_B$ to obtain an increase in transconductance and an improved linearity of the output signal in a specified range without resorting to transistors of the PNP type. Moreover, it proposes to ensure that none of the transistors of the amplifier can be saturated when the differential input voltage exceeds its normal range of operation.

Figure 2:
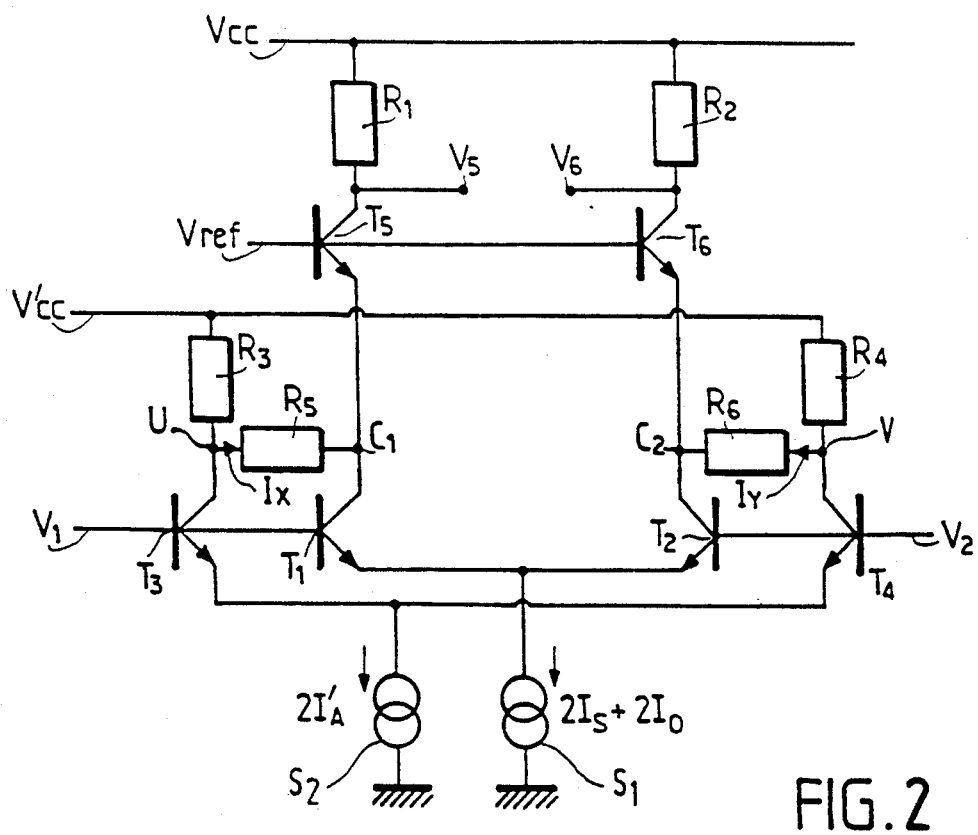
FIG. 2 is the circuit diagram of an embodiment of the invention.

FIG. 2 shows the circuit diagram of an example of an amplifier in accordance with the invention. In this Figure a main pair of input transistors $T_1$, $T_2$, a pair of cascode transistors $T_5$, $T_6$, and the load resistors $R_1$, $R_2$ are the same as in FIG. 1. The amplifier shown further comprises another pair of input transistors, referred to as the auxiliary pair and comprising the transistors $T_3$ and $T_4$ whose emitters are interconnected and driven by an emitter current source $S_2$. The bases of the corresponding transistors of the two pairs of input transistors are coupled to one other, the interconnected bases of the transistors $T_1$ and $T_3$ receiving the input voltage $V_1$ and the interconnected bases of the transistors $T_2$ and $T_4$ receiving the input voltage $V_2$. The voltage difference $V_1 - V_2$ again forms the differential input voltage $V_{in}$.

FIG. 2 shows how, in accordance with the invention, the collectors of the transistors of the auxiliary input pair are coupled to the collectors of the transistors of the main input pair so as to obtain the required function $f(V_{in})$. For this purpose a resistive bridge is formed by series resistors $R_3$ and $R_5$ arranged between a supply voltage $V'_{cc}$ and the collector of the input transistor $T_1$.

The node U of this first resistive bridge is connected to the collector of the transistor $T_3$. In a symmetric fashion a second resistive bridge comprises resistors $R_4$ and $R_6$ and has one end also connected to the supply voltage $V'_{cc}$ and has the other end connected to the collector of the transistor $T_2$, the node V of this second resistive bridge being connected to the collector of the transistor $T_4$. $C_1$ is the node between the emitter of the transistor $T_5$, the collector of the transistor $T_1$ and the resistor $R_5$ and, in a symmetric fashion, $C_2$ is the corresponding node between the emitter of the transistor $T_6$, the collector of the transistor $T_2$ and the resistor $R_6$.

First of all the case is considered in which the differential input voltage $V_{in}$ is zero. The voltage on the nodes $C_1$ and $C_2$ is substantially dictated by the emitters of the cascode transistors $T_5$ and $T_6$ and corresponds to the voltage $V_{REF}$ minus one forward junction voltage. Depending on the values selected for the current $2I'_A$ of the auxiliary emitter-current source $S_2$ and for the resistors $R_3$, $R_5$ and $R_4$, $R_6$ the voltages on the nodes U and V can be larger or smaller than the voltages on the nodes $C_1$ and $C_2$. It is assumed that the voltage on the nodes U and V is larger than the voltage on the nodes $C_1$ and $C_2$ and currents $I_X$ and $I_Y$ flow in the direction from the nodes U and V towards the nodes $C_1$ and $C_2$. This corresponds to currents $I_A$ and $I_B$ flowing in the same direction as those from the sources $I_A$ and $I_B$ in FIG. 1. Likewise, the inverse situation may be considered, i.e. a voltage on the nodes U and V smaller than that on the nodes $C_1$ and $C_2$, but the reasoning behind it remains the same.

Now it is assumed that the input voltage $V_1$ is higher than the input voltage $V_2$ ($V_{in}$ positive). The voltage on the node U decreases and the voltage on the node V increases relative to the balanced state. The variation of the current $I_X$ relative to the balanced state corresponds to a withdrawal of current from the collector of the transistor $T_1$ and, conversely, the variation of $I_Y$ corresponds to an injection of current at the collector of the transistor $T_2$. This result is in agreement with the desired function $f(V_{in})$ and yields both an increase in transconductance of the amplifier and an increase in linearity of the output voltage ($V_5 - V_6$) as a function of $V_{in}$ in the normal operating range.

The amplifier thus realised also has the advantage that the cascode transistors $T_5$ and $T_6$ act as interrupters when the differential input voltage $V_{in}$ exceeds the rated operating range of the amplifier.

It is now assumed that the differential input voltage $V_{in}$ is such that the transistors $T_1$ and $T_3$ are cut off. The voltage on the node U rises to the value of $V'_{cc}$ and so does the voltage on the node $C_1$ since they are connected by the resistor $R_5$. To ensure that the transistor $T_5$ is cut off the voltage $V'_{cc}$ should be large enough relative to the voltage $V_{REF}$. Finally, the transistors $T_1$, $T_3$ and $T_5$ are cut off and the output voltage $V_5$ is equal to the voltage $V_{cc}$. In the opposite branch of the amplifier the entire current $2I_S + 2I_0$ flows through the emitter of the transistor $T_2$ and the entire current $2I'_A$ flows through the emitter of the transistor $T_4$. The value of the resistor $R_4$ has been chosen in such a way that the voltage on the node V is higher than that which would bottom the transistor $T_4$. A current $I_Y$, whose value can be predetermined easily, is supplied to the collector of the transistor $T_2$. A current equal to the difference between said current and the current $2I_S + 2I_0$ flows through the cascode transistor $T_6$. The collector current of the transistor $T_6$ is substantially equal to the emitter current (except for the value of the base current). Consequently, the output voltage $V_6$ is formed by the voltage drop across the load resistor $R_2$, which voltage $V_6$ can be determined readily. It appears that none of the transistors of the amplifier can be driven into saturation even when the differential input voltage $V_{in}$ exceeds its normal operating range. Therefore, the maximum differential output voltage $V_5 - V_6$ can be predetermined easily.

Figure 3:
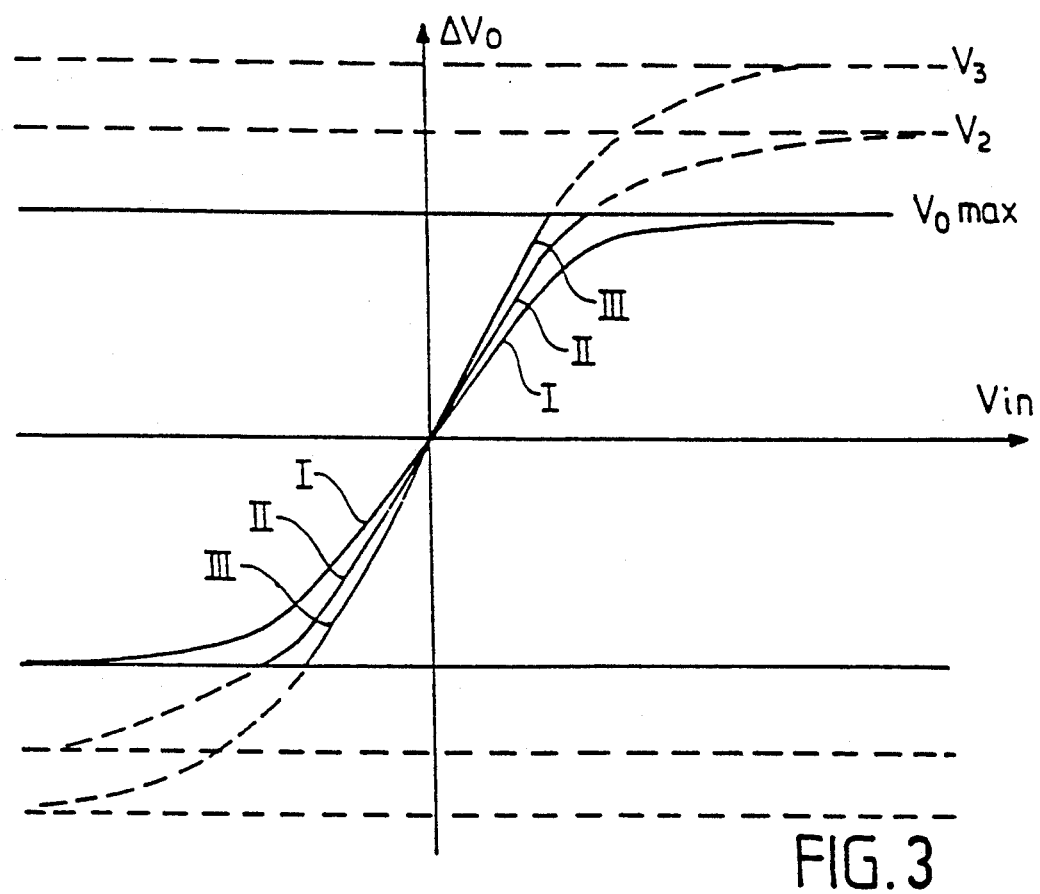
FIG. 3 shows curves representing the differential output voltage of prior-art devices and the device in accordance with the invention for comparison.

FIG. 3 shows curves representing the differential output voltage $\Delta V_0 = (V_5 - V_6)$ as a function of the differential input voltage $V_{in}$ for a conventional differential stage (curve I), for a prior-art differential stage EP-A-0,275,079 (curve II), and finally for the amplifier in accordance with the invention utilising a function $f(V_{in})$ of the currents $I_A$ and $I_B$ shown in FIG. 1.

For a conventional differential stage in which $I_A$, $I_B = 0$ the curve I is a hyperbolic tangent with an asymptote $V_{0max} = 2R_1 I_S$. This curve shows the drawbacks of such a conventional differential stage, i.e. the linear range of the output voltage, which is small in comparison with the operating range represented by the value $V_{0max}$.

The curve II represents the differential output voltage $\Delta V_0$ of a prior-art differential stage in which the currents comply with $I_A = I_B = I_0$. This curve shows that the transconductance is higher and that the asymptote $V_2$ corresponding to the hyperbolic tangent function in this case is larger, which asymptote is determined without limiting of the differential output voltage. Referred to the same value of $V_{0max}$ the curve II shows that the slope is steeper (the transconductance is higher) and that the linearity of the differential output voltage within the operating range has improved.

The curve III relates to the amplifier in accordance with the invention. As in this case the currents $I_A$ and $I_B$ (FIG. 1) have a value which varies with the input voltage $V_{in}$ the transconductance is even higher and the asymptotic value $V_3$ of $\Delta V_0$ without a limitation to a specific $V_{0max}$ is also larger.

As a result of this, the amplifier in accordance with the invention has a high transconductance (which increases as the currents of the emitter-current sources increases) and a linear output-voltage range bounded by the maximum output voltage, without any PNP transistors being used. Consequently, the amplifier in accordance with the invention has a large pass band and can be manufactured by means of a customary and inexpensive technology.

FIG. 2 shows a supply voltage $V'_{cc}$ which differs from the supply terminal $V_{cc}$. By using a regulated value for $V'_{cc}$ it is possible to obtain an output signal excursion which is independent of variations of $V_{cc}$. However, in a simplified embodiment the line $V'_{cc}$ is connected to the line $V_{cc}$. The preferred embodiment described hereinbefore comprises two different emitter-current sources $S_1$ and $S_2$, which facilitates control of the operation of the circuit. However, it is also possible to interconnect the emitters of the transistors $T_1$, $T_2$, $T_3$ and $T_4$ and to use only one emitter current source.

The invention is not limited to the embodiment described above. The NPN transistors may be replaced by NMOST transistors. The hyperbolic tangent functions mentioned with reference to FIG. 2 differ but the curves then obtained have a similar shape but are more gradual. Moreover, several current sources $I_A$ and $I_B$ may be arranged in parallel with other auxiliary transistor pairs and auxiliary resistive bridges in order to obtain finer linearity corrections.

I claim:

1. An amplifier having a differential stage comprising a main pair of input transistors and an auxiliary pair of input transistors coupled between a supply terminal and a reference terminal, the interconnected emitters of the main pair of input transistors being driven by an emitter current source which is also connected to the reference terminal, and the interconnected emitters of the auxiliary pair of input transistors being driven in a similar way, means connecting bases of the transistors of the main pair to corresponding bases of the transistors of the auxiliary pair, said bases forming input terminals for input voltages whose difference defines a differential input voltage, a part of the collector currents of the transistors of the auxiliary pair being used for a suitable summation with the collector currents of the transistors of the main pair to derive output currents of the differential stage which increase the linearity of said output currents in comparison with the differential input voltage, characterised in that the differential stage comprises a pair of cascode transistors whose collector-emitter paths are arranged as loads in the collectors of the transistors of the main pair, and whose bases are interconnected and connected to a fixed intermediate reference voltage, and said summation is effected by means of two resistive bridges connected between a supply voltage and each of the respective collectors of the transistors of the main pair of input transistors, the collectors of the transistors of the auxiliary pair being connected to respective nodes of respective resistive bridges.

2. An amplifier as claimed in claim 1, wherein said supply voltage is the same voltage as that on the supply terminal.

3. An amplifier as claimed in claim 2, wherein the emitters of the transistors of the auxiliary input pair are driven by an emitter current source distinct from that driving the emitters of the main pair of input transistors.

4. An amplifier as claimed in claim 1, wherein the emitters of the transistors of the auxiliary input pair are driven by an emitter current source distinct from that driving the emitters of the main pair of input transistors.

5. An amplifier as claimed in claim 1 further comprising a second emitter current source coupled between the interconnected emitters of the auxiliary pair of input transistors and the reference terminal thereby to drive said interconnected emitters of the auxiliary pair of input transistors.

6. An amplifier as claimed in claim 1 wherein said supply voltage is higher than the fixed intermediate reference voltage.

* * * * *